(12) United States Patent
Cullbom et al.

(10) Patent No.: US 6,545,559 B2
(45) Date of Patent: Apr. 8, 2003

(54) TUNING METHOD AND SYSTEM

(75) Inventors: Peter Cullbom, Lidingö (SE); Torbjörn Ahl, Stockholm (SE)

(73) Assignee: Telefonaktiebolaget LM Ericsson (publ), Stockholm (SE)

(*) Notice: Subject to any disclaimer, the term of this patent is extended or adjusted under 35 U.S.C. 154(b) by 0 days.

(21) Appl. No.: 09/785,532

(22) Filed: Feb. 20, 2001

(65) Prior Publication Data

US 2001/0024145 A1 Sep. 27, 2001

(30) Foreign Application Priority Data

Feb. 23, 2000 (SE) .............................................. 0000585

(51) Int. Cl.$^7$ ................................................ H03H 7/46
(52) U.S. Cl. ....................... 333/17.1; 333/126; 333/132
(58) Field of Search ................................ 333/17.1, 132, 333/235, 126, 174; 455/125

(56) References Cited

U.S. PATENT DOCUMENTS

| | | | | |
|---|---|---|---|---|
| 5,420,552 A | 5/1995 | Säkkä | ...................... | 333/17.1 |
| 5,448,769 A | 9/1995 | Jäntti | .......................... | 455/115 |
| 5,638,034 A | 6/1997 | Heikkilä et al. | ........... | 333/17.1 |
| 5,757,247 A | 5/1998 | Koukkari et al. | .......... | 333/17.1 |

*Primary Examiner*—Robert Pascal
*Assistant Examiner*—Dean Takaoka
(74) *Attorney, Agent, or Firm*—Nixon & Vanderhye P.C.

(57) ABSTRACT

Tuning method for a combiner filter (2) in an antenna (3) near system for base station equipment is disclosed. Transmitted signals related to the combiner filter are compared with each other. A spectral analysis of each of the transmitted signals is performed. The spectral analysis results regarding magnitudes and/or phases of the signals are compared. The combiner filter (2) is tuned based on the analysis in an iteration procedure until the combiner filter is in accordance with predetermined conditions.

27 Claims, 4 Drawing Sheets

TUNING METHOD AND SYSTEM

This invention relates essentially to a tuning method of the kind stated in the preamble of claim 1, and a system performing the method.

The invention relates to tuning of a combiner filter in an antenna near system for base station equipment. The invention relates to radio communication systems. In particular it relates to an antenna near system having products designed for combining transmitted power, where multiple carrier frequencies are used, for radio base station equipment.

BACKGROUND

Mobile radio telephony communication systems have grown immensely during the last years. Operators are currently facing severe problems regarding available transmit and receive frequency spectrum allocation. This is a general capacity problem. In conjunction with these problems the number of base station antennas must be minimised. The later is not only due to installation costs but also due to environmental aspects.

Therefore, high market demands have developed for radio base equipments able to use few antennas and still provide high traffic capacity, i.e. serve many calls simultaneously, as well as a limited use of the frequency spectrum.

STATE OF THE ARTS

Base station manufacturers often use filter combiners as the antenna near products of the base station in order to design base station equipment meeting the market demand for high capacity, few antennas and reasonable frequency spectral use. A combiner filter is a kind of adjustable band-pass filter. The filter combiners use filters to combine several transmit carriers towards the mobile stations to one and the same antenna. In order to make the system reasonably manageable for the operators, these filters usually have an automated tuning function, so that each filter can tune to the specific transmit carrier assigned to this particular combiner filter. A number of tuneable combiner filters are connected to one antenna.

PROBLEM

The intrinsic problem with filter combiners arises from the following fundamental conflict:

Operators want to have a narrow channel spacing, low loss and low loss variation. However, the filters cannot be designed to have perfect channel response and perfect out-of-band isolation, i.e. perfect attenuation between the channels.

For example, there are fairly broad band transmit signals in a GSM system to deal with. In particular, this is a problem for GSM EDGE, i.e. high speed data transmission. Narrow filters allowing for narrow channel spacing will impair on the transmitted signal quality.

Filters will drift in temperature. Therefore, once tuned there will still be a need to readjust them. Readjustments could also be needed by other reasons. A degrading of the transmitted signal by an inaccurate re-tuning process is not allowed during this process. The margin for tuning inaccuracy will be very small for a system, which allows a reasonable tight channel spacing.

RELATED ART

In U.S. Pat. No. 5,757,247 a system is described for adjusting a combiner filter. A RF (radio frequency) sample signal is derived proportional to the power of the input of the combiner filter. In one embodiment a sample of the output from the combiner filter is derived. The signals are down converted. The signal obtained has a DC component, which is removed. The signal strengths of the down converted signals are detected. The centre frequency of the combiner filter is adjusted on basis of the detected signal strengths.

OBJECTS

An object of the invention is to provide a tuning system, which will significantly enhance the performance regarding tuning accuracy of current combining systems.

Another object of the invention is to provide a tuning method or system, which will improve the readjustment of the filters when drifted in temperature and/or for some kind of time related changes.

INVENTION

A very precise tool for evaluating how the filters are tuned is obtained by performing a spectral analysis of the transmitted signal before the filter combining system and compare it with a spectral analysis of the outgoing signal from the filter combining system. This method allows for compensation of the measurement system characteristics, such as variation of response within a channel. Hence a clear picture of the true impact of the filter combining system can be derived.

The invention relates on a tuning method or system for a combiner filter in an antenna near system for base station equipment. The combiner filter is connected to a radio transmitter and is intended to have a centre frequency tuned to the carrier frequency of the radio transmitter. The transmitted signals related to the combiner filter are compared with each other. The system is characterized by means to perform a spectral analysis of each of the transmitted signals and compare the spectral analysis results regarding magnitudes and/or phases of the signals; and control means tuning the combiner filter based on the analysis in an iteration procedure until the combiner filter is tuned according to predetermined conditions.

The transmitted signals are preferably signals related to the input and the output of the combiner filter. Sampling means could sample the signals during a predetermined time interval for transfer into frequency domain. Comparing means could provide the spectral analysis of the transmitted signals regarding magnitudes and/or phases and compare the individual magnitudes and/or phases of predetermined frequencies with each other. A measuring circuitry could provide a pre-calibration of the signals in relation to an internal response of the circuitry and correction of the spectral comparison with the internal response.

Down converting means could convert the signals to a video frequency level. Gain controllable amplifier means could amplify each of the down converted signals before comparing them. Signal evaluation means could retrieve control the amplifiers means based on the signal magnitudes of the signals to be compared.

Evaluation means could perform a discrete Fourier transform or FIR filter analysis of the signals to be compared and correlate and/or error estimate their individual spectral density. FIR filter banks or analogue filter banks could perform the evaluation. The evaluation means could divide the signals (magnitudes and/or phases) related to the input and the output of the combiner filter in at least two frequency bands symmetrically around a centre frequency for the combiner filter. The tuning means could tune the combiner filter in iterative steps until the divided signals at the input and the output of the combiner filter are as near to each other as possible. The frequency bands could two, one on each side of the centre frequency, and then the evaluation means provides the ratio between Pfwd(low)/Pi(low) and compare it with the ratio Pfwd(high)/Pi(high), where Pi(low) is a low part below and Pi(high) is a high part above the centre frequency $f_0$ of a representation of the input to the combiner filter, Pfwd(low) is a low part below and Pfwd(high) a high part above the centre frequency $F_0$ of a representation of the output to the combiner filter. Alternatively, the frequency bands could be several on each side of the centre frequency, and the evaluation circuitry compare products of all the spectral components Pfwd(low) and Pi(low) with products of Pfwd(high) and Pi(high). The evaluation means could perform a Fast Fourier transform calculation of the signals and make a correlation of the individual spectral density of the signals. The evaluation means could comprise FIR filter banks or analogue filter banks. Instead, the evaluation means could perform an error estimation of the magnitudes and/or phases of the signals.

The system could be adapted to radio communication systems, for example global system for mobile telephony (GSM) systems or digital advanced mobile telephone service (DAMPS). Switching means could switch, for supervision purpose after tuning, from the signal representation of the output of the combiner filter to a signal (Prefl) related to a reflected signal from the antenna, to which the output of the combiner filter is transmitted.

The method according to the invention performs in the same way as stated for the system above.

ADVANTAGES

The invention relies on low cost signal processing techniques in conjunction with currently used measurement methods designed for optimum sensitivity for determining the power ratio for the signals transmitted through the filter combiner system.

The invention proposes a tuning measurement method, which will significantly enhance the performance of combining systems used nowadays.

BRIEF DESCRIPTION OF THE DRAWINGS

For a more complete understanding of the present invention an for further objects an advantages thereof, reference is now made to the following description taken in conjunction with the accompanying drawings, given as examples only, and in which.

DETAILED DESCRIPTION OF PREFERRED EMBODIMENTS

Figure 1:
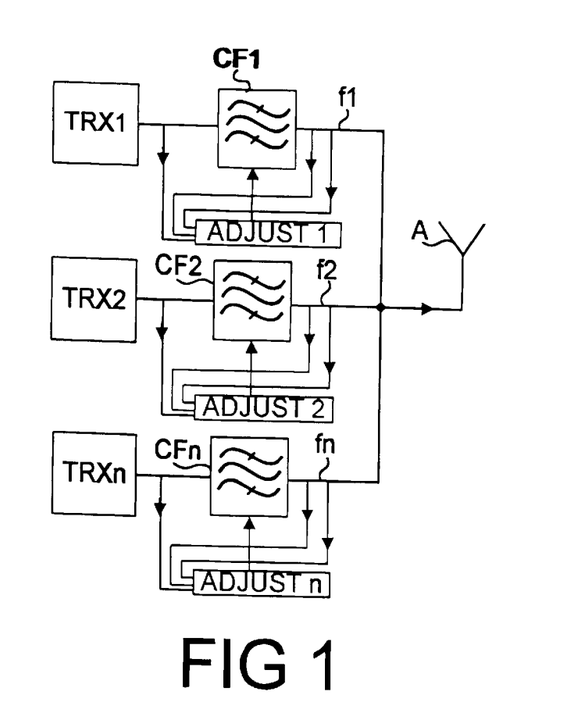
FIG. 1 is a block diagram illustrating the arrangement of transmitters for which the system according to the invention is intended.

Referring to FIG. 1, a number of radio transmitters TRX 1, TRX 2, . . . TRXn are each connected to an individual combiner filter CF1, CF2, . . . CFn, respectively. Each of the combiner filters are tuned to an individual carrier frequency f1, f2, . . . fn, respectively. The filters are connected to a combining system feeding a common antenna A in which consideration is taken to the filter characteristics and to the (electrical) distances to the filters.

The task of the invention is to provide an individual automatic tuning of each of the combiner filters in order to compensate for temperature and/or some kind of time related changes. This task is provided by an adjustment circuit ADJUST 1, ADJUST 2, ADJUST n for each combiner filter CF1, CF2, . . . CFn, respectively.

Figure 2:
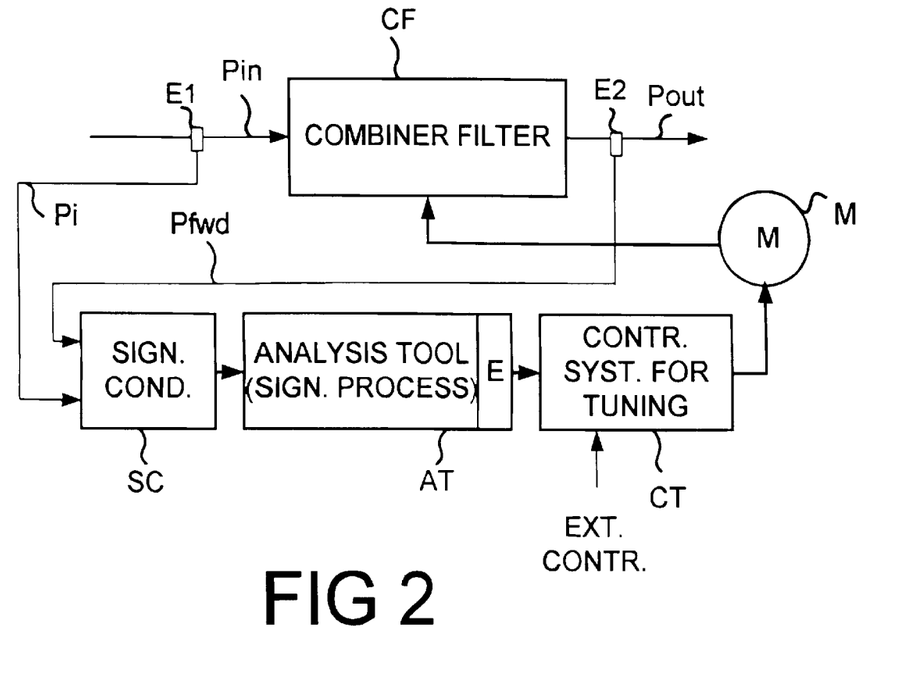
FIG. 2 is a block diagram illustrating schematically the principles of the invention.

Referring to FIG. 2 illustrating the principle of one of the TRX/combiner filters and its adjustment circuit. A representation signal Pi of the signal Pin to the combiner filter CF is extracted by an extracting unit E1 and connected to an embodiment of a circuitry to implement the invention. A representation signal Pfwd of the output Pout of the combiner filter CF is extracted by an extracting unit E2 and is also connected to the circuitry. It is to be noted that the input Pin and output Pout are negligibly influenced by this extraction.

The signals Pi and Pfwd are first processed in a signal conditioning circuit SC in order to put the signals in condition to be handled by the analysis tool AT using signal processing. The signal conditions for the signal conditioning circuit SC could be of different kinds.

The analysis tool is one of the essential parts of the invention and makes the spectral analysis of each of the extracted signals regarding their magnitudes and/or phases. The spectral analysis of the analysis tool could also be of various kinds. The analysis tool AT will also evaluate, in the block E, the analysed signals.

The evaluation information is then fed to a control system for tuning CT, which translates this information into suitable signals to control some unit M, such as a motor, some electrical action device or the like, to displace the filter to be tuned in accordance with predetermined conditions. The most likely condition is to optimise the combiner filter. However, there may also be other conditions, such as adaptation to other kind of circuitry in its vicinity or the like. The control system for tuning CT could also be controlled by an external control signal, which could provide some extra condition.

Figure 3:
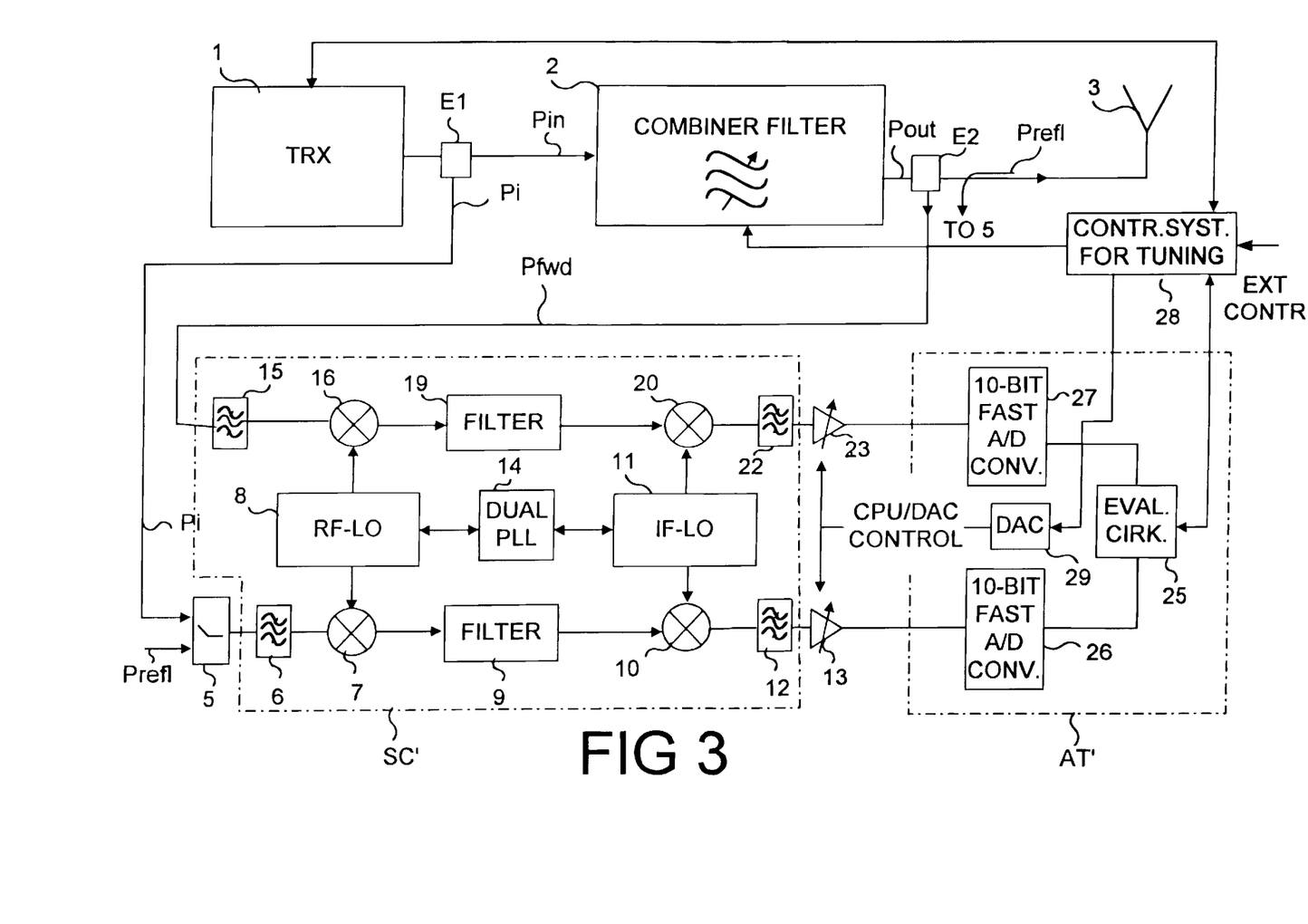
FIG. 3 illustrates schematically a first embodiment of the invention.

FIG. 3 shows an embodiment of the circuitry illustrated in FIG. 2. An input Pin is fed from the radio transmitter (TRX) 1 to the combiner filter 2. The output Pout of the combiner filter 2 is fed to the antenna 3. A signal Pi, extracted from the input Pin by an extracting unit E1 is fed to the signal conditioning circuit SC'. The signal Pi is there fed through a switch 5 and a band-pass filter 6 followed by one or two mixers 7,10 for down-converting the signal.

Another signal Prefl, representing signals reflected from the antenna 3, may also be connected to the switch 5, which when operated can switch between the signals Pi and Prefl. The signal Prefl is used with Pfwd for monitoring the status of the antenna or antenna system 3 after tuning.

In the embodiment shown in FIG. 3, an output of a radio frequency local oscillator 8 is fed to the other input of the mixer 7 in order to down-convert the carrier to radio frequency level as a first down-convert step. The signal from the mixer 7 is transmitted through a filter 9, for instance a saw-filter, to a second mixer 10, if used, having its other input connected to a local oscillator 11 having an intermediate frequency in order to down-convert the input signal Pi in a second step. The local oscillators 8 and 11 are connected to phase-locked loops 14. The down converted signal from the mixer 10 could then be fed to a controllable video amplifier 13 through a band-pass filter 12.

An output Pfwd, extracted from the output Pout from the combiner filter 2 by an extracting unit E2, is also fed to the signal conditioning circuit SC', and there via a band-pass filter 15 connected to a mixer 16. An output of the radio frequency local oscillator 8 is fed to the other input of the mixer 16 in order to down-convert the carrier to radio frequency level as a first down-convert step. The signal from the mixer 16 is transmitted through a filter 19, for instance a saw-filter, to another mixer 20 having its other input connected to the local oscillator 11 having an intermediate frequency in order to down-convert the output Pfwd in a second step. The down converted signal from the mixer 20 could then be fed to a controllable video amplifier 23 through a band-pass filter 22.

Even though the down-convert in the embodiment shown in FIG. 3 is made in two steps in the conditioning unit SC' it is to be noted that it could be made in only one step as well.

Detection and sampling will be performed on low intermediate frequency in order to lower the cost for the system. Typically the transmitted signal is down converted to a signal frequency below, sometimes well below, a few MHz.

Information regarding transmitted power for the next transmitted slot could thus be given from the transceiver system TRX to the measuring system. This information might be used to control high precision but low cost video amplifiers 13 and 23 operating on the intermediate frequency. Thus the TRX 1 could send a control signal to a control system for tuning 28, which, besides tuning the combiner filter 2, through a digital/analogue converter (DAC) 29 provides a regulation of the amplifiers 13 and 23. The CPU 28 could also provide a regulation of the same amplifiers as a reaction of an external control signal.

The outputs of the amplifiers 13 and 23 are fed to the analysis tool AT' comprising an evaluation circuitry 25 having signal processing features and functioning as a detector/sampler, through an analogue/digital converter 26 and 27, respectively. Each analogue/digital converter could for example be a ten-bit fast A/D converter. By this intermediate signal gain control the required operating dynamic range of the analogue/digital conversion system is increased, i.e. simplifies the equipment and lowers cost significantly.

As will be exemplified further below, the spectral analysis of the transmitted signals before and after the combiner filter 2 is evaluated by conventional methods, such as a Fast Fourier Transform calculation or by using DFT or FIR filter banks (FIR=Finite Impulse Response) (in 25). Analogue filter banks could also be considered. This allows for calibration in production for the measurement systems characteristics. Hence, compensation could be performed to the measurement systems characteristics.

The spectral densities of the input to and the output from the combiner filter 2 could thus be compared. These values should first be compensated with the internal measurement system response. In this way the filtering effect from the filters 6, 9,12, 15, 19, 22 of the combining circuitry for the transmitted signal are taken into consideration. For a "broadband" transmit signal, such as for GSM (Global Systems for Mobile Telephony) for example, this will give information on how close the optimal filter position has been set, and whether the filter is placed in frequency below or above the desired position. Information is also provided regarding the loss through the filter. The last mentioned information may be used for different status monitoring, as well as tuning on a more narrow-band signal (Digital Advanced Mobile Phone Service (DAMPS), Nordic Mobile Telephone (NMT), etc.). The tuning of the combiner filter 2 is performed in an iterative process. Thus, tuning is performed by comparing the signal samples of the combiner filter output Pfwd with the corresponding signal samples of the combiner filter output Pi.

The down converted and amplified extracted signal Pi to the combiner filter 2 and the down converted and amplified extracted signal Pfwd from the output of the combiner filter 2 are thus individually sampled by the A/D converters 26 and 27 and compared by the evaluation circuit 25, functioning as a digital signal processor. An acceptable frequency resolution of ca 2 kHz will be obtained together with some additional channel filtering by taking 256 samples at 500 kHz. A power density of 0.25 to 0.3 dB below the maximum value is to be expected for GSM at a centre frequency of ±40 kHz. Such a spectrum symmetric spectrum is to be achieved by the tuning in an iterative process of the re-tuning circuitry. The slope for a combiner filter designed for 400 kHz carrier spacing between the different radio transmitters TRX 1, TRX 2, . . . TRXn (in FIG. 1) will be about 0.25 dB/10 kHz. This gives a tool to determine in what direction the filter shall be tuned.

The evaluation circuitry 25 could also react if the signal levels of its input signals are beyond allowed limits and then control the two video amplifiers 13 and 23 accordingly or provide an alarm signal alarming that something has gone out of order.

The compare result provided by the evaluation circuitry 25 is fed to the central processing unit (CPU) 28. The CPU 28 calculates the tuning for the combiner filter 2 and controls an adjustment unit (not shown) to tune the filter 2 accordingly.

EXAMPLE (PRIOR ART)

A determination of whether the combiner filter is centred or not could be obtained by inspecting magnitudes of the spectrum of the power signals before (Pi) and after (Pfwd) the combiner filter 2. A simple but not satisfactorily accurate and easy way to tune is to provide a ratio Pfwd/Pi and to tune the combiner filter 2 in iteration steps until this ratio is maximal. The particular spectral analysis made in accordance with the invention is thus not made in this example.

Inventive Example 1

Figure 4A:
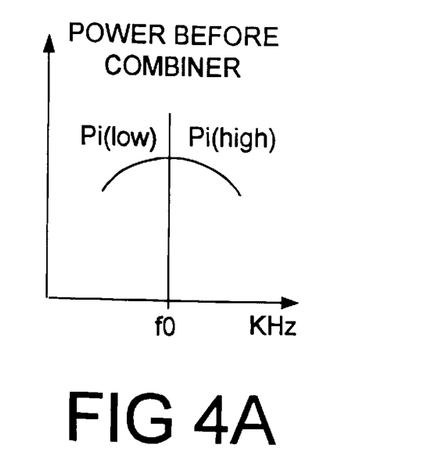
FIGS. 4A & B show graphs illustrating spectral magnitude distribution at the input and output of a combiner filter used at a first embodiment of tuning the combiner filter.
Figure 4B:
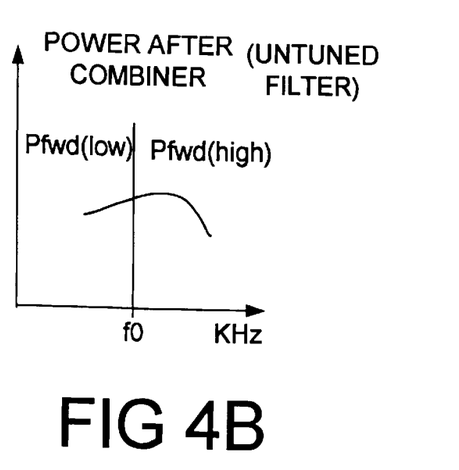

As apparent from FIGS. 4A, the power Pi could be divided into a low part Pi(low) below and a high part Pi(high) above the centre frequency $f_0$. FIG. 4B illustrates that the output power Pfwd also could be divided into a low part Pfwd(low) below and a high part Pfwd(high) above the centre frequency $f_0$. The curve form in FIG. 4B is displaced and distorted in relation to the curve form in FIG. 4A and the tuning is made in order to make the curve forms in the FIGS. 4A and 4B to more matched filter responses.

Tuning could then be made by providing the ratio between Pfwd(low)/Pi(low) and compare it with the ratio Pfwd(high)/Pi(high). This will give an indication on how the combiner filter shall be moved. If Pfwd(low)/Pi(low) is less than Pfwd(high)/Pi(high), then the combiner filter 2 is to be moved towards the "low" side. The movement is made in iteration steps until the difference between the compared ratios is minimised.

Inventive Example 2

Figure 5A:
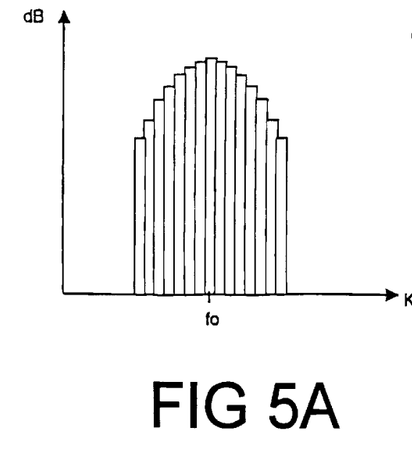
FIGS. 5A & B show graphs illustrating spectral density at the input and output of a combiner filter used at a second embodiment of tuning the combiner filter.
Figure 5B:
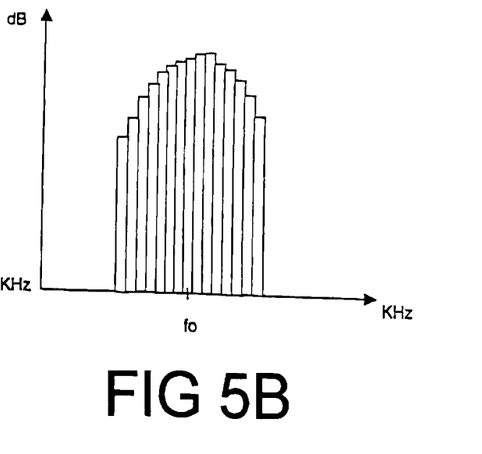

Correlation could also be performed by comparing the products of all the spectral components Pfwd(low) and Pi(low) with the products of Pfwd(high) and Pi(high). Thus, in this case the frequency band is divided into smaller bands, as illustrated in FIG. 5A, for power signals before the combiner filter 2 before the correlation. An asymmetrical spectrum provided for a de-tuned combiner filter 2, i.e., before the re-tuning operation, is illustrated in FIG 5B.

Different correlation methods could then be used.

Example 3

Figure 6A:
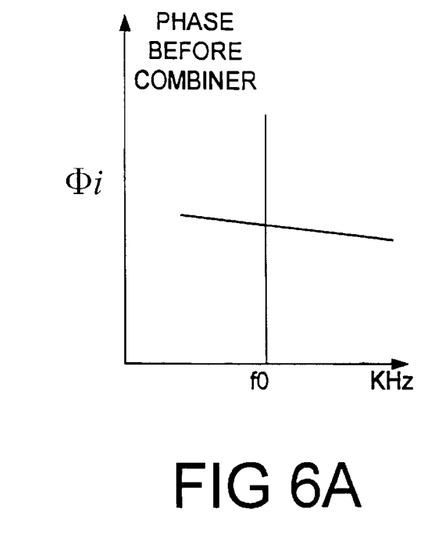
FIGS. 6A & B show graphs illustrating the phase plot of the input and output of a combiner filter used at a third embodiment of tuning the combiner filter.
Figure 6B:
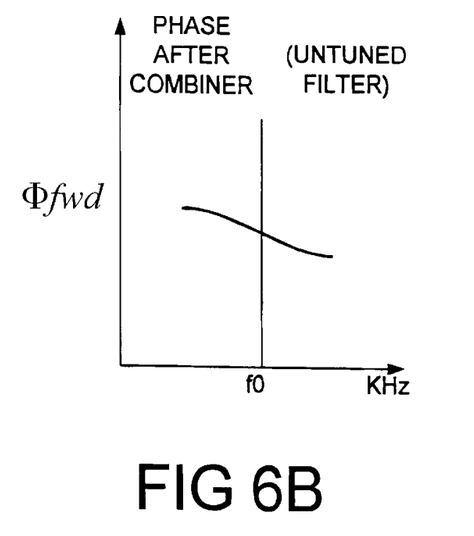

The phases of the signals below and above the centre frequency could be used for the comparison. FIG. 6A illustrates these phases of the power before the combiner filter 2, and FIG. 6B illustrates these phases of the power above the combiner filter. Error estimation could be performed by using the spectral components and evaluating power (Pi, Pfwd) and phase ($\Phi$i, $\Phi$fwd) components.

The method and system according to the invention thus allows for compensation of the measurement system characteristics, such as variation of response within a channel. Hence a clear picture of the true impact of the filter combining system can be derived.

Although the invention is described with respect to exemplary embodiments it should be understood that modifications can be made without departing from the scope thereof. Accordingly, the invention should not be considered to be limited to the described embodiments, but defined only by the following claims, which are intended to embrace all equivalents thereof.

We claim:

1. Tuning method for a combiner filter in an antenna system for base station equipment, the combiner filter being connected to a radio transmitter and being intended to have a centre frequency tuned to a carrier frequency of the radio transmitter, whereby transmitted signals related to the combiner filter are compared with each other, the method comprising:

performing a spectral density analysis of at least two of the transmitted signals, the spectral density analysis comprising dividing each of the signals into at least two spectral components having different predetermined frequencies;

comparing the spectral density analysis results regarding magnitudes and/or phases of the predetermined frequencies of the signals; and tuning the combiner filter based on the spectral density analysis in an iteration procedure until the combiner filter is tuned according to predetermined conditions.

2. Tuning method according to claim 1, characterized in that the transmitted signals are signals related to the input and the output of the combiner filter.

3. Tuning method according to claim 1, further comprising:

providing the spectral density analysis of the transmitted signals regarding magnitudes and/or phases by sampling the signals during a predetermined time interval, or with a predetermined number of samples at a predetermined sampling rate, for transfer into the frequency domain; and comparing the individual magnitudes and/or phases of predetermined frequencies with each other.

4. Tuning method according to claim 1, characterized in that the method is adapted to radio communication systems, for example global system for mobile telephony (GSM) systems or digital advanced mobile telephone service (DAMPS).

5. Tuning method according to claim 1, further comprising:

down converting the signals to a video frequency level;

amplifying each of the down converted signals with a gain controllable amplifier before comparing them;

controlling the amplifiers based on the signal strengths of the signals to be compared.

6. Tuning method according to claim 1, further comprising switching, for supervision purpose after tuning, such that the transmitted signals is at least a signal (Pi) related to the input of the combiner filter and a signal Prefl related to a reflected signal from the antenna to which the output of the combiner filter is transmitted; and comparing the signals (Pi) and (Prefl).

7. A tuning method for a combiner filter in an antenna system for base station equipment, the combiner filter being connected to a radio transmitter and being intended to have a centre frequency tuned to a carrier frequency of the radio transmitter, the method comprising:

performing a spectral density analysis of each of transmitted signals;

comparing the spectral density analysis results regarding magnitudes and/or phases of the signals;

tuning the combiner filter based on the spectral density analysis in an iteration procedure until the combiner filter is tuned according to predetermined conditions; and performing a discrete Fourier transform, DFT and/or FIR filter analysis of the signals representing the input and output of the combiner filter based on evaluation and/or error estimation methods of their individual spectra.

8. A tuning method for a combiner filter in an antenna system for base station equipment, the combiner filter being connected to a radio transmitter and being intended to have a centre frequency tuned to a carrier frequency of the radio transmitter, the method comprising:

performing a spectral density analysis of each of transmitted signals;

comparing the spectral density analysis results regarding magnitudes and/or phases of the signals;

tuning the combiner filter based on the spectral density analysis in an iteration procedure until the combiner filter is tuned according to predetermined conditions;

providing a pre-calibration of the signals to be compared in relation to an internal response of a measuring circuitry; and correcting the result of the comparison with the internal response.

9. Tuning system for a combiner filter in an antenna system for base station equipment, the combiner filter being connected to a radio transmitter and being intended to have a centre frequency tuned to the carrier frequency of the radio transmitter, whereby transmitted signals related to the combiner filter are compared with each other, the tuning system comprising:

means for performing a spectral density analysis of each of the transmitted signals, the spectral density analysis comprising dividing each of the signals into at least two spectral components, and comparing the spectral density analysis results regarding magnitudes and/or phases of the spectral components of the signals;

control means for tuning the combiner filter based on the spectral density analysis in an iteration procedure until the combiner filter is tuned according to predetermined conditions; and switching means for switching, for supervision purpose after tuning, from the output of the combiner filter to a signal related to a reflected signal from the antenna, to which the output of the combiner filter is transmitted.

10. Tuning system according to claim 9, characterized in that the system is adapted to radio communication systems, for example global system for mobile telephony (GSM) systems or digital advanced mobile telephone service (DAMPS).

11. Tuning system according to claim 9, characterized by a measuring circuitry providing a pre-calibration of the signals in relation to an internal response of the circuitry and correction of the spectral comparison with the internal response.

12. Tuning system according to claim 9, characterized by sampling means sampling the signals during a predetermined time interval, or with a predetermined number of samples at a predetermined sampling rate, for transfer into frequency domain;

comparing means for providing the spectral analysis of the transmitted signals regarding magnitudes and/or phases and comparing the individual magnitudes and/or phases of predetermined frequencies with each other.

13. Tuning system according to claim 9, characterized in that the transmitted signals are signals (Pi, Pfwd) related to the input and the output of the combiner filter.

14. Tuning system according to claim 13, characterized by down converting means to convert the signals to a video frequency level;

gain controllable amplifier means for amplifying each of the down converted signals before comparing them;

control system to control the amplifiers means based on predetermined conditions of the signal magnitudes of the signals to be compared.

15. Tuning system according to claim 13, characterized by evaluation means performing a discrete Fourier transform, DFT or FIR filter analysis of the signals to be compared and for correlating and/or error estimation their individual spectral density.

16. Tuning system according to claim 15, characterized by FIR filter banks or analogue filter banks to perform evaluation.

17. Tuning system for a combiner filter in an antenna system for base station equipment, the combiner filter being connected to a radio transmitter and being intended to have a centre frequency tuned to the carrier frequency of the radio transmitter, whereby transmitted signals related to the combiner filter are compared with each other, the tuning system comprising:

means for performing a spectral density analysis of each of the transmitted signals, the spectral density analysis comprising dividing each of the signals into at least two spectral components, and comparing the spectral density analysis results regarding magnitudes and/or phases of the spectral components of the signals;

control means for tuning the combiner filter based on the spectral density analysis in an iteration procedure until the combiner filter is tuned according to predetermined conditions;

evaluation means for dividing the signals (magnitudes and/or phases) related to the input and the output of the combiner filter in at least two frequency bands symmetrically around a centre frequency for the combiner filter; and tuning means for tuning the combiner filter in iterative steps until the divided signals at the input and the output of the combiner filter fulfill predetermined conditions.

18. Tuning system according to claim 17, characterized in that the frequency bands are two, one on each side of the centre frequency, and that the evaluation means provides the ratio between Pfwd(low)/Pi(low) and compare it with the ratio Pfwd(high)/Pi(high), where Pi(low) is a low part below and Pi(high) is a high part above the centre frequency fo of a representation of the input to the combiner filter, Pfwd (low) is a low part below and Pfwd(high) a high part above the centre frequency $f_0$ of a representation of the output to the combiner filter.

19. Tuning system according to claim 17, characterized in that the frequency bands are several on each side of the centre frequency, and that the evaluation circuitry compares products of all the spectral components Pfwd (low) and Pi(low) with products of Pfwd(high) and Pi(high), where Pi(low) is a low part below and Pi(high) is a high part above the centre frequency f0 of a representation of the input to the combiner filter, Pfwd(low) is a low part below and Pfwd (high) a high part above the centre frequency f0 of a representation of the output to the combiner filter.

20. Tuning system according to claim 17, characterized in that the evaluation means performs a Fast Fourier transform calculation of the signals and makes a correlation of the individual spectral density of the signals.

21. Tuning system according to claim 17, characterized in that the evaluation means comprises FIR filter banks or analogue filter banks.

22. Tuning system according to claim 17, characterized in that the evaluation means performs an error estimation of the magnitudes and/or phases of the signals.

23. A tuning method for a combiner filter in an antenna system for base station equipment, the combiner filter being connected to a radio transmitter and being intended to have a centre frequency tuned to a carrier frequency of the radio transmitter, the method comprising:

performing a spectral density analysis of each of transmitted signals;

comparing the spectral density analysis results regarding magnitudes and/or phases of the signals;

tuning the combiner filter based on the spectral density analysis in an iteration procedure until the combiner filter is tuned according to predetermined conditions;

wherein the transmitted signals relate to the input and output of the combiner filter, respectively;

dividing the signals (magnitudes and/or phases) related to the input and the output of the combiner filter in at least two frequency bands symmetrically around a predetermined centre frequency; and tuning the combiner filter in iterative steps until the divided signals at the input and the output of the combiner filter are in accordance with predetermined conditions.

24. A tuning system for a combiner filter in an antenna system for base station equipment, the combiner filter being connected to a radio transmitter and being intended to have a centre frequency tuned to a carrier frequency of the radio transmitter, whereby transmitted signals related to the combiner filter are compared with each other, the tuning system comprising:

means for performing a spectral density analysis of at least two of the transmitted signals, the spectral density analysis comprising dividing each of the signals into at least two spectral components having different predetermined frequencies;

means for comparing the spectral density analysis results regarding magnitudes and/or phases of the predetermined frequencies of the signals; and control means for tuning the combiner filter based on the spectral density analysis in an iteration procedure until the combiner filter is tuned according to predetermined conditions.

25. Tuning method for a combiner filter in an antenna system for base station equipment, the combiner filter being connected to and/or in communication with a radio transmitter and being intended to have a centre frequency tuned to a carrier frequency of the radio transmitter, so that transmitted signals related to the combiner filter are compared with each other, the method comprising:

performing a spectral density analysis of at least two of the transmitted signals;

calculating a value of a first parameter based on the magnitude and/or phase of a first signal and of a second signal at a first predetermined frequency;

calculating a value of a second parameter based on the magnitude and/or phase of the first signal and of the second signal at a second predetermined frequency different than the first frequency; and comparing the values of the calculated first and second parameters.

26. The method of claim 25, further comprising tuning the combiner filter based on the spectral density analysis in an iteration procedure until the combiner filter is tuned according to predetermined conditions.

27. A tuning system for a combiner filter in an antenna system for base station equipment, the combiner filter being connected to and/or in communication with a radio transmitter and being intended to have a centre frequency tuned to a carrier frequency of the radio transmitter, so that transmitted signals related to the combiner filter are compared with each other, the tuning system comprising:

means for performing a spectral density analysis of at least two of the transmitted signals by calculating a value of a first parameter based on the magnitude and/or phase of a first signal and of a second signal at a first predetermined frequency, and calculating a value of a second parameter based on the magnitude and/or phase of the first signal and of the second signal at a second predetermined frequency different than the first frequency;

means for comparing the values of the calculated first and second parameters; and means for tuning the combiner filter based on the spectral density analysis in an iteration procedure.

* * * * *